(12) United States Patent
Park

(10) Patent No.: US 7,622,759 B2
(45) Date of Patent: Nov. 24, 2009

(54) SEMICONDUCTOR DEVICES AND METHODS OF MANUFACTURING THE SAME

(75) Inventor: Sung-chan Park, Seoul (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 150 days.

(21) Appl. No.: 11/702,210

(22) Filed: Feb. 5, 2007

(65) Prior Publication Data

US 2007/0182017 A1    Aug. 9, 2007

(30) Foreign Application Priority Data

Feb. 7, 2006    (KR)    ............... 10-2006-0011569

(51) Int. Cl.
*H01L 27/108* (2006.01)
(52) U.S. Cl. .................... 257/296; 257/E21.66
(58) Field of Classification Search .......... 257/296, 257/300, 306, 309, 308, E21.648, E21.66, 257/E27.088, E21.086
See application file for complete search history.

(56) References Cited

U.S. PATENT DOCUMENTS 6,924,526 B2 *    8/2005    Fukuda et al. ............... 257/309

FOREIGN PATENT DOCUMENTS

| JP | 2004-335526 | 11/2004 |
|---|---|---|
| KR | 10-1997-0003848 A | 1/1997 |
| KR | 10-1999-0084311 A | 12/1999 |
| KR | 10-2001-0059181 | 7/2001 |
| KR | 100307528 | 8/2001 |
| KR | 10-2001-0095943 A | 11/2001 |

OTHER PUBLICATIONS

Notice of Allowance from the Korean Intellectual Property Office, dated Jan. 30, 2008, for the corresponding Korean patent application (4 pp.).

* cited by examiner

*Primary Examiner*—David Vu
(74) *Attorney, Agent, or Firm*—Harness, Dickey & Pierce, P.L.C.

(57) ABSTRACT

A semiconductor device includes a lower conductive layer formed on a semiconductor substrate, an interlayer insulating film that at least substantially covers the lower conductive layer, a plurality of contact holes formed in the interlayer insulating film to expose an upper surface of the lower conductive layer so that at least some of the contact holes are closer to each other in a long-axis direction than in a short-axis direction; and contact plugs that plug the contact holes. Upper portions of at least some of the contact holes have an oval shape or shapes. A method of manufacturing the semiconductor device includes forming the lower conductive layer, forming the interlayer insulating film, forming the plurality of contact holes in the interlayer insulating film to expose the upper surface of the lower conductive layer, and plugging the contact holes to form the contact plugs.

10 Claims, 3 Drawing Sheets

SEMICONDUCTOR DEVICES AND METHODS OF MANUFACTURING THE SAME

PRIORITY STATEMENT

This application claims priority from Korean Patent Application No. 10-2006-0011569 filed on Feb. 7, 2006, in the Korean Intellectual Property Office (KIPO), the entire contents of which are incorporated herein by reference.

BACKGROUND

1. Field

Example embodiments relate to semiconductor devices and methods of manufacturing the semiconductor devices. Also, example embodiments relate to semiconductor devices and methods of manufacturing the semiconductor devices in which short-circuits caused by contact bowing may be reduced and/or prevented.

2. Description of Related Art

Generally, a metal contact acts as a conductive line that electrically connects an adhesion region to metal wires or a lower conductive layer to upper metal wires during a multi-layered metal wiring process for wiring semiconductor devices.

But as the area of individual elements is reduced to achieve size reduction and higher integration of the semiconductor devices, the width of contact holes typically is reduced also. Furthermore, as the area of individual elements (for example, capacitors) is reduced, the height of these elements may be increased to improve their performance, thus increasing the thickness of an interlayer insulating film used to insulate the elements. In a process of forming a contact hole to expose a lower conductive layer in a thick interlayer insulating film, a High Aspect Ratio Contact (HARC) hole having a large width may be formed in the interlayer insulating film. When ions are scattered and reflect by a hard mask during plasma etching of the contact hole, a bowing phenomenon may occur in the HARC hole. In the bowing phenomenon, the ions may collide with an upper part of a wall of the contact hole due to the high aspect ratio, which further etches the inside of the contact hole. This bowing enlarges the contact hole so that the width of the contact hole is larger than a desired size.

Therefore, since an interval between the contact holes may be reduced and the width of the contact hole may be enlarged, if the contact holes where the bowing occurs are contiguous to each other, an electrical short-circuit may occur between two adjacent contact holes.

SUMMARY

Example embodiments may provide semiconductor devices that have contact holes for reducing and/or preventing electrical short-circuits.

Example embodiments may provide methods of manufacturing semiconductor devices that have contact holes for reducing and/or preventing electrical short-circuits.

According to example embodiments, the semiconductor devices may include a lower conductive layer formed on a semiconductor substrate, an interlayer insulating film that substantially covers the lower conductive layer, a plurality of contact holes formed in the interlayer insulating film to expose an upper surface of the lower conductive layer so that at least some of the contact holes may be closer to each other in a long-axis direction than in a short-axis direction, and/or contact plugs that plug the contact holes. According to example embodiments, upper portions of at least some of the contact holes have an oval shape or shapes.

According to example embodiments, the methods may include forming a lower conductive layer on a semiconductor substrate, forming an interlayer insulating film that substantially covers the lower conductive layer, forming a plurality of contact holes in the interlayer insulating film to expose an upper surface of the lower conductive layer so that at least some of the contact holes may be closer to each other in a long-axis direction than in a short-axis direction, and/or plugging the contact holes to form contact plugs. According to example embodiments, upper portions of at least some of the contact holes have an oval shape or shapes.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1A:
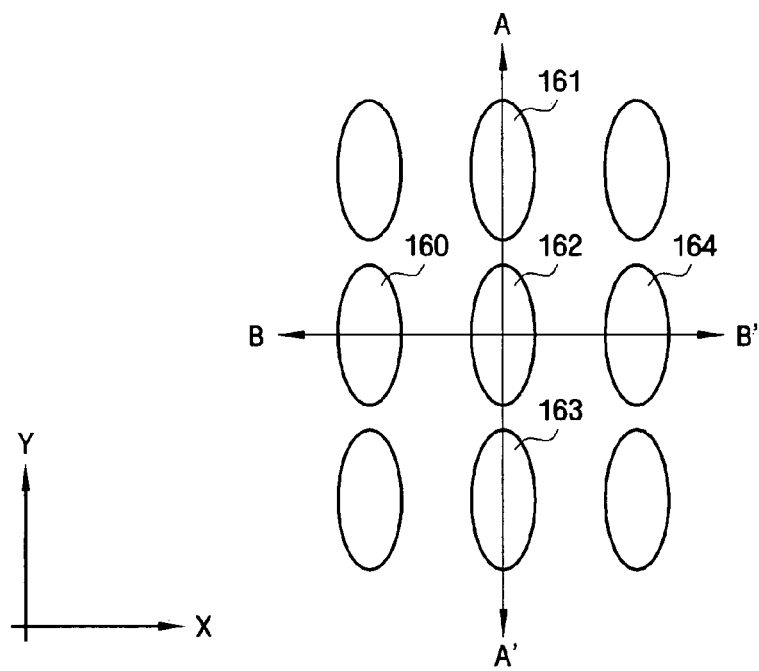
FIGS. 1A and 1B are a layout and a sectional view, respectively, of a semiconductor device including contact holes according to an example embodiment.

Example embodiments will now be described more fully with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation(s) depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1B:
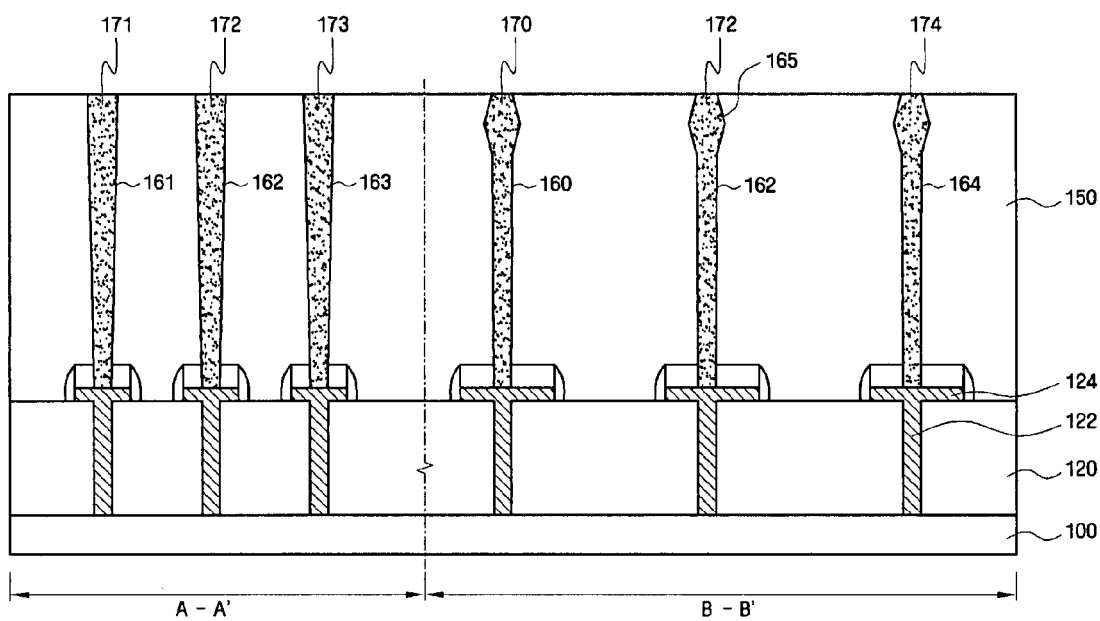

FIG. 1A is a layout of a semiconductor device including contact holes according to an example embodiment. FIG. 1B is a sectional view of the semiconductor device of FIG. 1A.

With reference to FIGS. 1A and 1B, lower conductive layer 124 may be formed on semiconductor substrate 100. The lower conductive layer 124 may include a bit line.

Interlayer insulating film 150 may be formed, for example, to cover lower conductive layer 124.

A plurality of contact holes 160 to 164 may be formed through the interlayer insulating film 150 to expose an upper surface of the lower conductive layer 124. Upper portions of at least some of the contact holes 160 to 164 may have, for example, an oval shape or shapes. Example embodiments include at least 5% of the upper portions of the contact holes 160 to 164 having an oval shape or shapes. Similarly, example embodiments include at least 10%, 15%, 20%, 25%, 30%, 35%, 40%, 45%, 50%, 55%, 60%, 65%, 70%, 75%, 80%, 85%, 90%, 95%, and/or 100% of the upper portions of the contact holes 160 to 164 having an oval shape or shapes. Example embodiments include upper portions of at least some of the contact holes 160 to 164 having one or more elliptical or substantially elliptical shapes. Example embodiments include upper portions of at least some of the contact holes 160 to 164 having one or more substantially round shapes.

At least some of the contact holes 160 to 164 may be aligned or substantially aligned. For example, if the contact holes 160 to 164 have one or more shapes with long-axis directions and short-axis directions, the long-axis directions of some or all of the contact holes 160 to 164 may be aligned or substantially aligned and/or the short-axis directions of some or all of the contact holes 160 to 164 may be aligned or substantially aligned. The long-axis directions may be perpendicular or substantially perpendicular to the short-axis directions. The contact holes 160 to 164 may be, for example, closer to each other in a long-axis direction than in a short-axis direction. FIG. 1A shows, for example, the long-axis width of the contact holes 160 to 164 substantially parallel to the line A-A' (Y-axis) and the short-axis width of the contact holes 160 to 164 substantially parallel to the line B-B' (X-axis). Many other orientations of widths and/or axes are possible.

In example embodiments, contact holes 160 to 164 having a high aspect ratio (HARC holes) may be formed, where the aspect ratio is the ratio of the height of a respective contact hole 160 to 164 to a width of the respective contact hole 160 to 164, and where the width is measured in a long-axis direction or a short-axis direction.

Furthermore, contact plugs 170 to 174 may be formed to plug respective contact holes 160 to 164.

According to example embodiments, even though HARC holes may be formed, bowing may not tend to occur in the long-axis direction of the contact holes 160 to 164.

Referring to FIGS. 1A and 1B, the short-axis width (substantially parallel to the line B-B') of each of the contact holes 160 to 164 may be smaller than the long-axis width (substantially parallel to the line A-A'). In example embodiments, bowing 165 may tend to occur at portions of the contact holes 160 to 164 that have higher aspect ratios. Accordingly, since the aspect ratio of the contact holes 160 to 164 in the short-axis direction may be higher than that in the long-axis direction, the bowing 165 may tend to occur in the short-axis direction. Therefore, if the contact holes 160 to 164 are formed to have an oval shape or shapes according to this example embodiment, the bowing 165 may be formed to have a critical dimension (CD) that is larger than the short-axis width of the contact holes 160 to 164. For example, the CD may be the same or nearly the same as the long-axis width of the contact holes 160 to 164.

Therefore, as shown in FIG. 1A, the contact holes 160 to 164 may be disposed so that at least some of the contact holes 160 to 164 may be closer to each other in the long-axis direction than in the short-axis direction and, thus, electrical short-circuits between the contacts may be reduced and/or prevented. For example, the contact holes 160 to 164 may be disposed so that at least 10% of the contact holes 160 to 164 may be closer to each other in the long-axis direction than in the short-axis direction. Similarly, the contact holes 160 to 164 may be disposed so that at least 15%, 20%, 25%, 30%, 35%, 40%, 45%, 50%, 55%, 60%, 65%, 70%, 75%, 80%, 85%, 90%, 95%, and/or 100% of the contact holes 160 to 164 may be closer to each other in the long-axis direction than in the short-axis direction.

In example embodiments, the ratio of a short-axis width to a long-axis width of one or more of the contact holes 160 to 164 may be greater than or equal to about 0.5:1 and less than or equal to about 0.95:1. For example, the ratio of the short-axis width to the long-axis width of each of the contact holes 160 to 164 may be greater than or equal to 0.5:1 and less than or equal to 0.95:1. In example embodiments, the ratio of the short-axis width to the long-axis width of some or all of the contact holes 160 to 164 may be greater than or equal to 0.55:1, 0.6:1, 0.65:1, 0.7:1, and/or 0.75:1. Similarly, in example embodiments, the ratio of the short-axis width to the long-axis width of some or all of the contact holes 160 to 164 may be less than or equal to 0.9:1, 0.85:1, 0.8:1, and/or 0.75:1.

Further, one or more of the contact holes 160 to 164 may have aspect ratio(s) greater than or equal to about 10:1 and less than or equal to about 40:1. For example, all of the contact holes 160 to 164 may have aspect ratio(s) greater than or equal to 10:1 and less than or equal to 40:1. In example embodiments, some or all of the contact holes 160 to 164 may have aspect ratio(s) greater than or equal to 12:1, 14:1, 16:1, 18:1, 20:1, and/or 25:1. Similarly, in example embodiments, some or all of the contact holes 160 to 164 may have aspect ratio(s) less than or equal to 35:1, 30:1, and/or 25:1.

The depth of one or more of the contact holes 160 to 164 may be greater than or equal to about 1.5 µm. For example, all of the contact holes 160 to 164 may have depth(s) greater than 1.5 µm. Similarly, some or all of the contact holes 160 to 164 may have depth(s) greater than 2.0 µm, 2.5 µm, 3.0 µm, 3.5 µm, 4.0 µm, 4.5 µm, and/or 5 µm.

An interval between two or more of the contact holes 160 to 164 may be greater than or equal to about 20 nm and less than or equal to about 100 nm in the long-axis direction. For example, intervals between some or all of the contact holes 160 to 164 may be greater than or equal to 20 nm and less than or equal to 100 nm in the long-axis direction. In example embodiments, intervals between some or all of the contact holes 160 to 164 may be greater than or equal to 25 nm, 30 nm, 35 nm, 40 nm, 45 nm, 50 nm, 55 nm, and/or 60 nm in the long-axis direction. Similarly, in example embodiments, intervals between some or all of the contact holes 160 to 164 may be less than or equal to 95 nm, 90 nm, 85 nm, 80 nm, 75 nm, 70 nm, 65 nm, and/or 60 nm in the long-axis direction.

In example embodiments, an insulating film 120 may be formed between the semiconductor substrate 100 and the lower conductive layer 124. A bit line contact 122 between the lower conductive layer 124 and the semiconductor substrate 100 may be connected to a drain region (not shown) of the semiconductor device in the insulating film 120.

Hereinafter, application to a DRAM of the contact-hole structure of FIGS. 1A and 1B and a method of producing the contact-hole structure will be shown and described.

A semiconductor device according to another example embodiment will be described with reference to FIGS. 2 and 3. For convenience, a DRAM is illustrated. Semiconductor devices to which contact holes according to example embodiments and production methods thereof may be applied include highly integrated semiconductor devices such as, for example, DRAMs, EEPROMs, EPROMs, masked ROMs, NVRAMs, PROMs, SRAMs, and flash memories.

Figure 2:
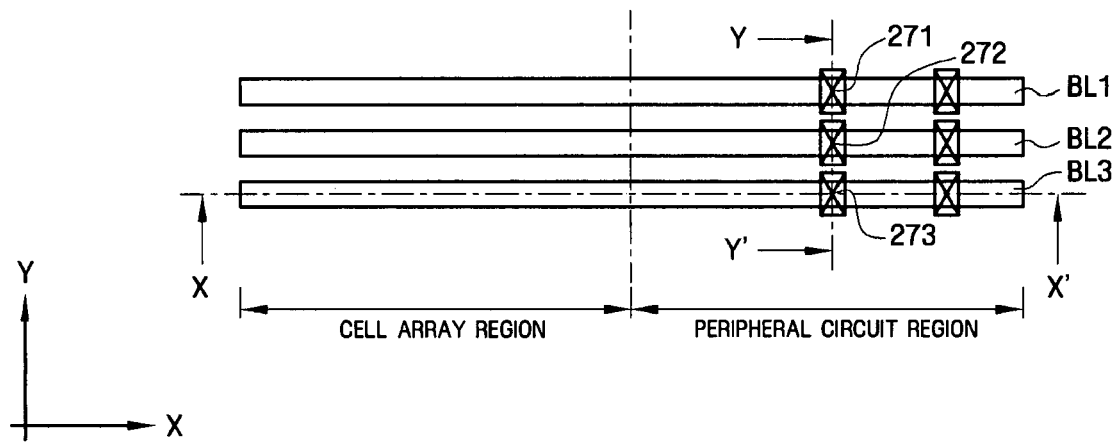
FIG. 2 is a layout showing the application of the contact-hole structure of FIGS. 1A and 1B to a dynamic random access memory (DRAM)

FIG. 2 is a layout showing the application of the contact-hole structure of FIGS. 1A and 1B to a DRAM. In FIG. 2, a cell array region and a peripheral circuit region are both shown. FIG. 3 is a sectional view showing a DRAM to which contact holes according to example embodiments may be applied. The cell array region of FIG. 3 is a section taken along the X-axis of FIG. 2 and the peripheral circuit region is a section taken along the Y-axis of FIG. 2.

A plurality of bit lines BL1, BL2, and BL3 may be arranged and a plurality of contact plugs 271, 272, and 273, through which the bit lines BL1, BL2, and BL3 may be connected to upper wire layers, may be formed on the bit lines BL1, BL2, and BL3. An interval between the bit lines BL1, BL2, and BL3 in the Y-axis corresponds to a minimum line width to which a design rule may be applied. Furthermore, the contact plugs 271, 272, and 273 also may depend on the design rule. Accordingly, a margin between the contact plugs 271, 272, and 273, which may have a high aspect ratio, may be narrow in the Y-axis direction. However, in the X-axis direction, a margin between the contact plugs 271, 272, and 273 may be larger than the design rule of the minimum line width. Therefore, as to the margin between the contact plugs 271, 272, and 273 in the Y-axis direction, it may be important to form contact plugs 271, 272, and 273 based on the design rule so that electrical short-circuits may be reduced and/or prevented.

As described above, contact plugs 271, 272, and 273 according to another example embodiment may be formed so that contact holes 261, 262, and 263 may be closer to each other in the long-axis direction in an area where the margin between the contact holes 261, 262, and 263 may be narrow, thereby reducing and/or preventing electrical short-circuits. In connection with this, since the margin between the contact holes 261, 262, and 263 may be narrow in the Y-axis direction, the contact holes 261, 262, and 263 may be formed, for example, so that their long axis may be parallel or substantially parallel to the Y-axis.

Figure 3:
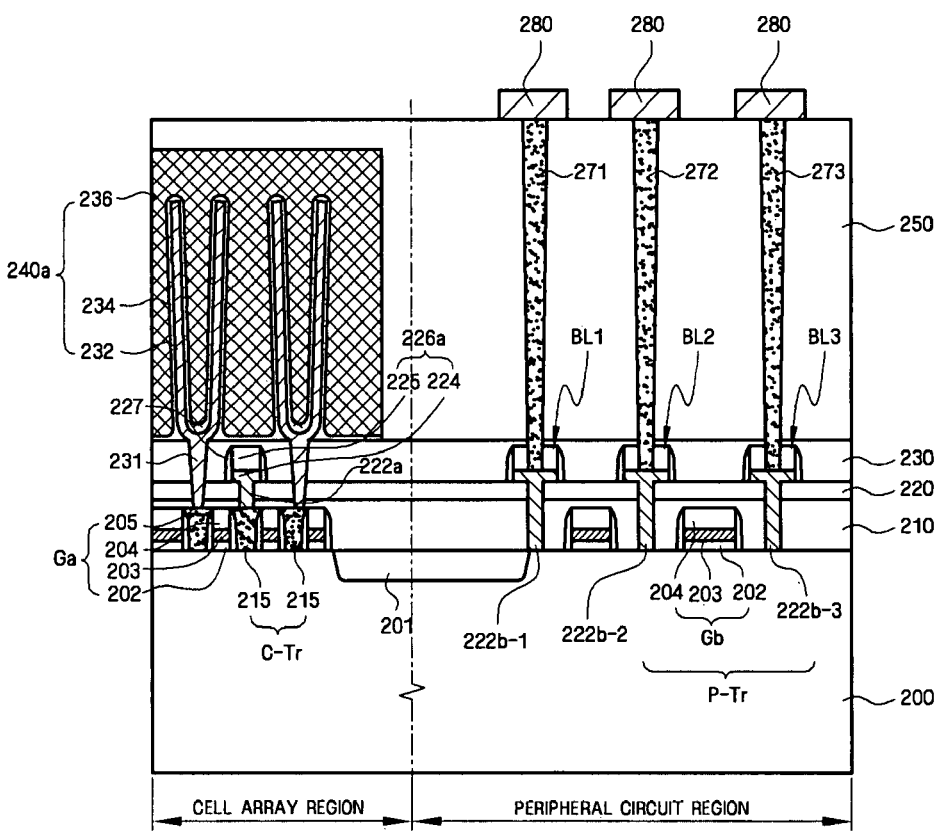
FIGS. 3 to 5 are sectional views illustrating the production of the DRAM of FIG. 2.

Referring to FIGS. 2 and 3, an element isolation region 201 may be formed on the semiconductor substrate 200 to define an active region. Gate insulating films 202; laminated conductive films 203 formed, for example, by laminating a doped polysilicone film and a tungsten silicide film; and capping insulating films 204 may be sequentially deposited in the cell array region and the peripheral circuit region and may be patterned to form gate electrodes Ga and Gb. Spacers 205 may be formed on the walls of the gate electrodes Ga and Gb, thereby forming transistors.

Landing pads 215 that may be connected to source and drain regions of a cell transistor (C-Tr) may be formed in a first interlayer insulating film 210. Furthermore, a bit line contact 222a, that may be connected to the landing pad 215 connected to the drain region of the cell transistor (C-Tr), and a plurality of contacts 222b-1, 222b-2, and 222b-3, that may be respectively connected to a plurality of bit lines BL1, BL2, and BL3 of the peripheral circuit transistor (P-Tr), may be formed. Example embodiments may include a second interlayer insulating film 220 at least partially formed on the first interlayer insulating film 210.

The bit lines BL1, BL2, and BL3, that may be connected to a plurality of peripheral circuit contacts 222b-1, 222b-2, and 222b-3, may be formed along with a bit line 226a connected to the bit line contact 222a. The bit line 226a (and the bit lines BL1, BL2, and BL3) may include lower conductive layer 224 and hard mask 225.

A storage node contact 231, that may be connected to the landing pad 215 connected to the source region of the cell transistor (C-Tr), may be formed in a third interlayer insulating film 230.

Example embodiments may include cell capacitor 240a, including storage electrode 232, dielectric film 234, and/or conductive film 236. Example embodiments also may include sidewall spacers 227.

A fourth interlayer insulating film 250 may be formed to at least partially cover the lower conductive layer 224 and bit lines BL1, BL2, and BL3. Further, a plurality of contact holes 261, 262, and 263 may be formed through the fourth interlayer insulating film 250 to expose an upper surface of the lower conductive layer 224. The upper portions of the contact holes 261, 262, and 263 may have, for example, an oval shape or shapes. The contact holes 261, 262, and 263 may be closer to each other in the long-axis direction than in the short-axis direction, and the contact plugs 271, 272, and 273 may be formed in the contact holes 261, 262, and 263.

Upper metal wires 280, that may be connected through the contact plugs 271, 272, and 273 to the bit lines BL1, BL2, and BL3, may be formed.

Hereinafter, a method of manufacturing the semiconductor device shown in FIG. 2 will be described referring to FIGS. 4 and 5.

Figure 4:
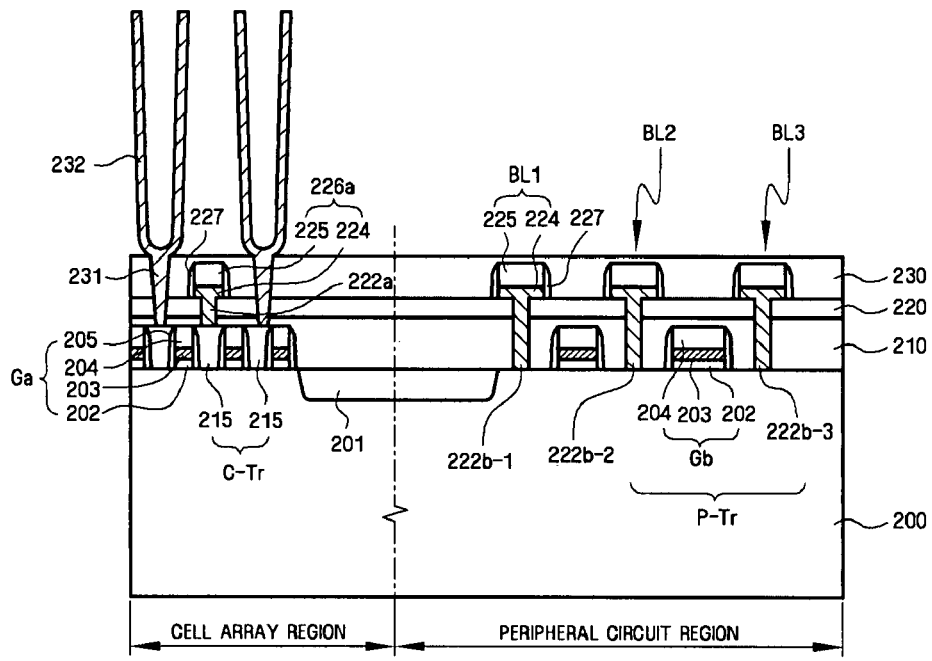
Figure 5:
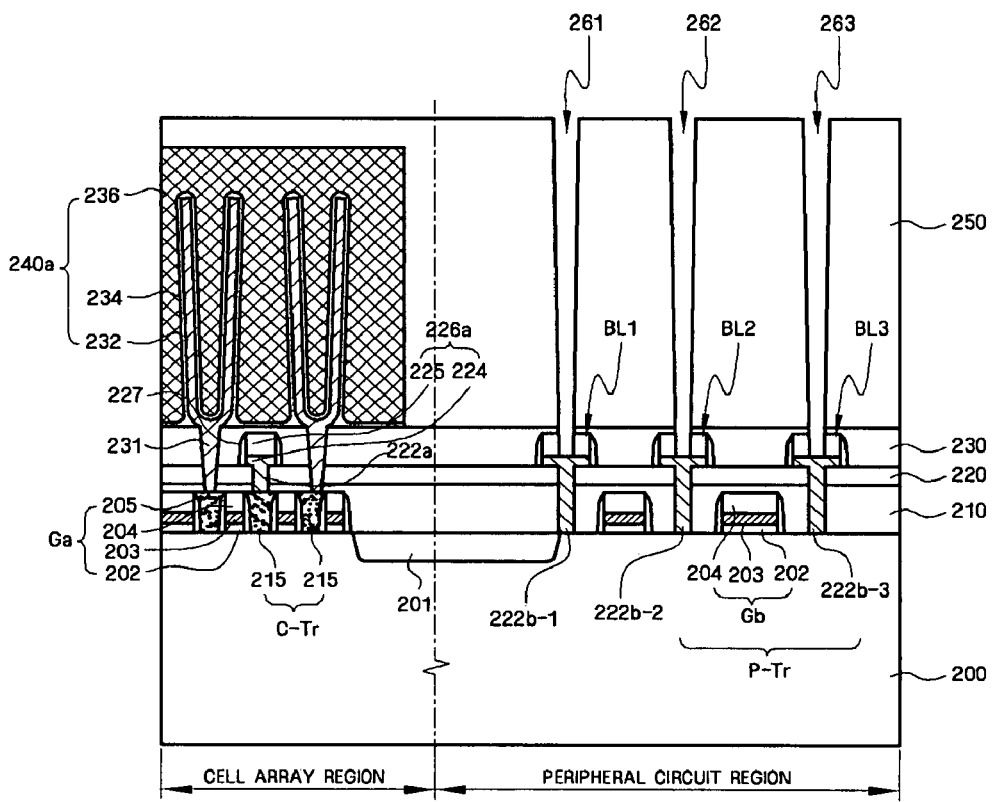

FIG. 4 is a sectional view of an intermediate structure where a storage electrode 232 may be formed.

With reference to FIG. 4, a semiconductor substrate 200 that includes an active region defined by an element isolation region 201 may be prepared. After a shallow trench having a depth greater than or equal to about 3000 Å and less than or equal to about 4000 Å, for example, is formed in the p-type semiconductor substrate 200, the trench may be filled with an oxide film having an excellent filling property and then may be planarized to form a shallow trench isolation (STI) region that may be used as the element isolation region 201. The cell transistors (C-Tr) and the peripheral circuit transistors (P-Tr) may be formed in the cell array region and the peripheral circuit region of the semiconductor substrate 200 using a typical complimentary metal-oxide-semiconductor (CMOS) process. In detail, n-type or p-type impurities may be ion implanted to form a well region (not shown). Gate insulating films 202; laminated conductive films 203 formed, for example, by laminating a doped polysilicone film and a tungsten silicide film; and/or capping insulating films 204 may be sequentially deposited and may be patterned to form gate electrodes Ga and Gb. Ions for forming low concentration source/drain regions (not shown), and ions for forming halo regions (not shown) may then be implanted. Subsequently, spacers 205 may be provided on walls of the gate electrodes Ga and Gb, and ions for forming high concentration source/drain regions (not shown) may then be implanted to form the cell transistors (C-Tr) and/or the peripheral circuit transistors (P-Tr).

Subsequently, a first interlayer insulating film 210 may be formed on substantially an entire surface of the semiconductor substrate 200 using a material having an excellent step-coating property. The landing pads 215, which may be self-aligned by the gate electrode Ga and the spacers 205 and may be connected to the source and drain regions of the cell transistors (C-Tr), may then be formed in the first interlayer insulating film 210. The landing pads 215 may be formed, for example, using doped polysilicone.

A second interlayer insulating film 220 may be formed, for example, using a high-density plasma oxide film and may be anisotropically etched to form a plurality of contact holes. The contact holes may be plugged with a diffusion barrier, such as TiN, and/or a metal film, such as tungsten, and then may be planarized to form bit line contacts 222a, that may be connected to the landing pads 215 connected to the drain regions of the cell transistors (C-Tr), and a plurality of contacts 222b-1, 222b-2, and 222b-3, that may be connected to a plurality of bit lines BL1, BL2, and BL3 of the peripheral circuit transistors (P-Tr).

Bit lines BL1, BL2, and BL3, that may be connected to a plurality of peripheral circuit contacts 222b-1, 222b-2, and 222b-3, may be formed along with a bit line 226a connected to a bit line contact 222a. The bit line 226a (and the bit lines BL1, BL2, and BL3) may include conductive film 224 and hard mask 225. The conductive film 224 may include a diffusion barrier, such as TiN, and a metal film, such as tungsten. Additionally, sidewall spacers 227 may be formed on the sidewalls of the bit line 226a and/or the bit lines BL1, BL2, and BL3.

After the bit line 226a is formed, a third interlayer insulating film 230 may be formed. A storage node contact 231, that may be connected to the landing pad 215 connected to the source region of the cell transistor (C-Tr), may be formed in the third interlayer insulating film 230. The storage node contact 231 is formed, for example, with doped polysilicone. Subsequently, a storage electrode 232 that may be connected to the storage node contact 231 may be formed. The storage electrode 232 may be formed, for example, using doped polysilicone in a single cylinder shape.

In the specification, the storage electrode 232 having a single cylinder shape is described, but the shape of the storage electrode is not limited to the cylinder shape. The storage electrode may be, for example, a storage electrode having a one cylinder stack (OCS) or a stacked structure depending on the configuration and the shape of the semiconductor device.

Subsequently, with reference to FIG. 5, a cell capacitor 240a may be created, and a plurality of contact holes 261, 262, and 263, that may be connected to the bit lines BL1, BL2, and BL3, may be formed.

A dielectric film 234 may be formed on substantially an entire surface of the semiconductor substrate 200 on which the storage electrode 232 is formed. The dielectric film 234 may include a single film, such as a tantalum oxide film ($Ta_2O_5$) and/or an aluminum oxide film ($Al_2O_3$), or a layered film, such as tantalum oxide film/titanium oxide film and/or an aluminum oxide film/titanium oxide film. Additionally, a conductive film 236 may be formed to form a plate node. The conductive film 236 may include a doped single polysilicone layer, or a layered film comprised of a diffusion barrier and/or a doped polysilicone layer. If TiN is used as the diffusion barrier, the barrier may be formed to a thickness greater than or equal to about 300 Å and less than or equal to about 400 Å using, for example, a chemical vapor deposition (CVD) process, and/or the doped polysilicone layer may be formed to a thickness greater than or equal to about 2000 Å and less than or equal to about 3000 Å through, for example, a low-pressure chemical vapor deposition (LPCVD) process using reaction gas, such as $SiH_4$ or $Si_2H_6$, and doping gas, such as $PH_3$, at temperature(s) greater than or equal to about 600° C. and less than or equal to about 700° C. Subsequently, the conductive film 236 and the dielectric film 234 may be patterned to complete the production of the cell capacitor 240a.

Subsequently, a fourth interlayer insulating film 250 may be formed on the conductive film 236 and on the entire surface or substantially the entire surface of the resultant structure. The fourth interlayer insulating film 250 may be formed to a thickness which may be enough to cover a difference in the level of the cell array region and the peripheral circuit region.

A plurality of contact holes 261, 262, and 263 may be formed in the fourth interlayer insulating film 250 to expose the conductive layer 224, i.e., the lower conductive layer. The contact holes may be closer to each other in the long-axis direction than in the short-axis direction. According to example embodiments, upper portions of at least some of the contact holes 261, 262, and 263 have an oval shape or shapes. Example embodiments include upper portions of at least some of the contact holes 261, 262, and 263 having one or more elliptical or substantially elliptical shapes. Example embodiments include upper portions of at least some of the contact holes 261, 262, and 263 having one or more substantially round shapes.

At least some of the contact holes 261, 262, and 263 may be aligned or substantially aligned. For example, if the contact holes 261, 262, and 263 have one or more shapes with long-axis directions and short-axis directions, the long-axis directions of some or all of the contact holes 261, 262, and 263 may be aligned or substantially aligned and/or the short-axis directions of some or all of the contact holes 261, 262, and 263 may be aligned or substantially aligned. The long-axis directions may be perpendicular or substantially perpendicular to the short-axis directions. The contact holes 261, 262, and 263 may be, for example, closer to each other in a long-axis direction than in a short-axis direction. Many orientations of widths and/or axes are possible.

The contact holes 261, 262, and 263 may be disposed so that at least some of the contact holes 261, 262, and 263 may be closer to each other in the long-axis direction than in the short-axis direction and, thus, electrical short-circuits between the contacts may be reduced and/or prevented. For example, the contact holes 261, 262, and 263 may be disposed so that at least 10% of the contact holes 261, 262, and 263 may be closer to each other in the long-axis direction than in the short-axis direction. Similarly, the contact holes 261, 262, and 263 may be disposed so that at least 15%, 20%, 25%, 30%, 35%, 40%, 45%, 50%, 55%, 60%, 65%, 70%, 75%, 80%, 85%, 90%, 95%, and/or 100% of the contact holes 261, 262, and 263 may be closer to each other in the long-axis direction than in the short-axis direction.

In example embodiments, the ratio of a short-axis width to a long-axis width of one or more of the contact holes 261, 262, and 263 may be greater than or equal to about 0.5:1 and less than or equal to about 0.95:1. For example, the ratio of the short-axis width to the long-axis width of each of the contact holes 261, 262, and 263 may be greater than or equal to 0.5:1 and less than or equal to 0.95:1. In example embodiments, the ratio of the short-axis width to the long-axis width of some or all of the contact holes 261, 262, and 263 may be greater than or equal to 0.55:1, 0.6:1, 0.65:1, 0.7:1, and/or 0.75:1. Similarly, in example embodiments, the ratio of the short-axis width to the long-axis width of some or all of the contact holes 261, 262, and 263 may be less than or equal to 0.9:1, 0.85:1, 0.8:1, and/or 0.75:1.

Further, one or more of the contact holes 261, 262, and 263 may have aspect ratio(s) greater than or equal to about 10:1 and less than or equal to about 40:1. For example, all of the contact holes 261, 262, and 263 may have aspect ratio(s) greater than or equal to 10:1 and less than or equal to 40:1. In example embodiments, some or all of the contact holes 261, 262, and 263 may have aspect ratio(s) greater than or equal to 12:1, 14:1, 16:1, 18:1, 20:1, and/or 25:1. Similarly, in example embodiments, some or all of the contact holes 261, 262, and 263 may have aspect ratio(s) less than or equal to 35:1, 30:1, and/or 25:1.

The depth of one or more of the contact holes 261, 262, and 263 may be greater than or equal to about 1.5 μm. For example, all of the contact holes 261, 262, and 263 may have depth(s) greater than 1.5 μm. Similarly, some or all of the contact holes 261, 262, and 263 may have depth(s) greater than 2.0 μm, 2.5 μm, 3.0 μm, 3.5 μm, 4.0 μm, 4.5 μm, and/or 5 μm.

An interval between two or more of the contact holes 261, 262, and 263 may be greater than or equal to about 20 nm and less than or equal to about 100 nm in the long-axis direction. For example, intervals between some or all of the contact holes 261, 262, and 263 may be greater than or equal to 20 nm and less than or equal to 100 nm in the long-axis direction. In example embodiments, intervals between some or all of the contact holes 261, 262, and 263 may be greater than or equal to 25 nm, 30 nm, 35 nm, 40 nm, 45 nm, 50 mm, 55 nm, and/or 60 nm in the long-axis direction. Similarly, in example embodiments, intervals between some or all of the contact holes 261, 262, and 263 may be less than or equal to 95 nm, 90 nm, 85 nm, 80 nm, 75 nm, 70 nm, 65 nm, and/or 60 nm in the long-axis direction.

A photosensitive film or a hard mask film (not shown) may be deposited on an upper surface of the fourth interlayer insulating film 250 to form a plurality of contact holes 261, 262, and 263. Subsequently, a portion of the photosensitive film or the hard mask film, which corresponds in position to the contact holes 261, 262, and 263, may be opened and etched to expose an upper surface of the conductive film 224, i.e., the lower conductive layer. The etching process may be, for example, a high density plasma reactive ion etching (HDP RIE) process. A main reaction gas that is used in an HARC process may be, for example, a fluorocarbon-based gas, and an additional reaction gas may be, for example, oxygen ($O_2$) and/or argon (Ar). Furthermore, the fluorocarbon-based gas may be classified into a saturation type and/or an unsaturation type.

Therefore, the contact holes 261, 262, and 263 having the high aspect ratio may be etched through a single step while the flow rates of $C_xF_y$, $O_2$, and Ar may be changed. For example, $C_2F_6$ gas and a gas mixture of $C_4F_8$, $O_2$, and Ar may be used. Furthermore, a gas mixture of $C_5F_8$, $O_2$, and Ar may be used.

Alternatively, in consideration of a possibility of undesirable etching caused by the high aspect ratio, the etching may be conducted with $C_xF_y$, $O_2$, and Ar, and additional etching may be then performed with $C_xH_yF_z$ (2 steps).

During a plasma etching process, plasma ions may be scattered by the photosensitive film or the hard mask film.

In detail, when the ions may be scattered, if tangent lines to collision points are drawn, the ions may reflect perpendicularly to the tangent lines and collide. Accordingly, the ions more frequently collide in the contact holes 261, 262, and 263 in the short-axis direction than in the long-axis direction. That is, since the movement distance of the ions in the short-axis direction may be shorter than that of the ions in the long-axis direction, regarding the number of collisions, the collisions in the short-axis direction may be more frequent than the collisions in the long-axis direction. Therefore, the ions may more frequently collide with walls of the contact holes 261, 262, and 263 in the short-axis direction than in the long-axis direction, so that the walls of the contact holes 261, 262, and 263 may be more etched in the short-axis direction than in the long-axis direction. This may cause an electrical short-circuit between the contact holes if a margin between the contact holes 261, 262, and 263 is narrow.

However, if the contact holes 261, 262, and 263 are arranged so that they are closer to each other in the long-axis direction than in the short-axis direction at a portion where the margin between the contact holes 261, 262, and 263 may be narrow, even though bowing occurs in the short-axis direction, which may enlarge the contact holes, since the occurrence of the bowing may be reduced in the long-axis direction, enlargement of the contact holes may be reduced and/or prevented. Thus, the interval between the contact holes may be maintained.

Accordingly, electrical short-circuits caused by the bowing may be reduced and/or prevented in contact holes having a high aspect ratio. Further, the margin between the contact holes may be maintained, thus it may be possible to form highly integrated contact holes.

Subsequently, after the etching process is completed, the photosensitive film or the hard mask film may be removed.

Turning to FIG. 3, the contact holes 261, 262, and 263 may be plugged to form contact plugs 271, 272, and 273.

To form the contact plugs 271, 272, and 273, the contact holes 261, 262, and 263 may be plugged with a diffusion barrier, such as TiN, and/or a metal film, such as tungsten.

Subsequently, the upper metal wires 280 may be formed on the upper surface of the fourth interlayer insulating film 250. A conductive film made of Al, Ti, W, Ti/Al, TiN/Al, TiN/Al/TiN, or a mixture thereof may be formed and then may be patterned to form upper metal wires 280b-1, 280b-2, and 280b-3 (not shown) connected to the contact plugs 271, 272, and 273.

Therefore, the upper metal wires 280 may be electrically connected through the contact plugs 271, 272, and 273 to the conductive film 224 of the lower conductive layer formed in the semiconductor substrate 200.

Next, a multilayered metal wiring process may be conducted to form a via and a second metal wire, a guard ring pattern film may be formed in a fuse region, and/or a passivation film may be formed. They are not shown in the drawings.

As described above, bowing may occur due to a reduction in the width of the contact hole, an increase in the thickness of the interlayer insulating film, and/or the high aspect ratio of the contact hole due to high integration of the semiconductor device. However, the contact holes according to the example embodiments may be arranged so that the contact holes are closer to each other in the long-axis direction than in the short-axis direction in a portion where the margin between the contact holes is narrow, thereby reducing and/or preventing electrical short-circuits caused by the bowing, which is an HARC etching property.

Additionally, instead being of increased, the original width of the contact holes may be maintained in the long-axis direction, and the width of the contact hole may be set to be shorter in the short-axis direction than in the long-axis direction in order to prevent the bowing from occurring. Thus, it may be possible to form contact holes in which electrical short-circuits may be reduced and/or prevented without increasing an area of the contact hole. Also, the width of the contact hole may be larger in the long-axis direction at a portion where the margin is wider in comparison with the original width of the contact hole.

The contact holes may be arranged so that the contact holes may be closer to each other in the long-axis direction than in the short-axis direction. Thus, electrical short-circuits between the contact holes may be reduced and/or prevented. Since the occurrence of bowing may be reduced in the long-axis direction, the interval between the holes may be maintained in the long-axis direction, thus it may be possible to achieve high integration.

The above-mentioned method of manufacturing the semiconductor device may have one or more advantages as described below.

First, contact holes may be arranged so that the contact holes may be closer to each other in the long-axis direction than in the short-axis direction, thereby reducing and/or preventing electrical short-circuits between the contact holes caused by the bowing.

Second, since electrical short-circuits between the contact holes may be reduced and/or prevented, erroneous operation of the element may be reduced, which improves performance and reliability.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor device, comprising:
   a lower conductive layer formed on a semiconductor substrate;
   an interlayer insulating film that at least substantially covers the lower conductive layer;
   a plurality of contact holes formed in the interlayer insulating film to expose an upper surface of the lower conductive layer, wherein the plurality of contact holes have long-axis width, a diameter in a long-axis direction, and short-axis width, a diameter in the short-axis direction, smaller than the long-axis width, respectively, and at least some of the contact holes are closer to each other in the long-axis direction than in short-axis direction; and
   contact plugs that fill and plug the contact holes;
   wherein upper portions of at least some of the contact holes have an oval shape or shapes.

2. The semiconductor device of claim 1, wherein a ratio of the short-axis width to the long-axis width of one or more of the contact holes is greater than or equal to about 0.5:1 and less than or equal to about 0.95:1.

3. The semiconductor device of claim 1, wherein an aspect ratio of one or more of the contact holes is greater than or equal to about 10:1 and less than or equal to about 40:1.

4. The semiconductor device of claim 1, wherein a depth of one or more of the contact holes is greater than or equal to about 1.5 μm.

5. The semiconductor device of claim 1, wherein an interval between two or more of the contact holes is greater than or equal to about 20 nm and less than or equal to about 100 nm in the long-axis direction.

6. A semiconductor device, comprising:
   a semiconductor substrate having a cell array region and a peripheral circuit region;
   a lower conductive layer formed on the semiconductor substrate;
   an interlayer insulating film that at least substantially covers the lower conductive layer;
   a plurality of contact holes formed in the interlayer insulating film deposited on the peripheral circuit region to expose an upper surface of the lower conductive layer, wherein the plurality of contact holes have long-axis width, a diameter in a long-axis direction, and short-axis width, a diameter in a short-axis direction, smaller than the long-axis width, respectively, and at least some of the contact holes are closer to each other in the long-axis direction than in the short-axis direction; and
   contact plugs that fill and plug the contact holes;
   wherein upper portions of at least some of the contact holes have an oval shape or shapes.

7. The semiconductor device of claim 6, wherein a ratio of the short-axis width to the long-axis width of one or more of the contact holes is greater than or equal to about 0.5:1 and less than or equal to about 0.95:1.

8. The semiconductor device of claim 6, wherein an aspect ratio of one or more of the contact holes is greater than or equal to about 10:1 and less than or equal to about 40:1.

9. The semiconductor device of claim 6, wherein a depth of one or more of the contact holes is greater than or equal to about 1.5 μm.

10. The semiconductor device of claim 6, wherein an interval between two or more of the contact holes is greater than or equal to about 20 nm and less than or equal to about 100 nm in the long-axis direction.

* * * * *